United States Patent [19]

Kimura

[11] 4,358,842
[45] Nov. 9, 1982

[54] RECORD PLAYER
[75] Inventor: Shuichi Kimura, Tokyo, Japan
[73] Assignee: Sony Corporation, Tokyo, Japan
[21] Appl. No.: 166,987
[22] Filed: Jul. 8, 1980
[30] Foreign Application Priority Data
  Jul. 10, 1979 [JP] Japan .................. 54/86438
[51] Int. Cl.³ .............................................. G11B 3/12
[52] U.S. Cl. .................. 369/233; 369/247; 318/615
[58] Field of Search ........... 369/219, 220, 221, 222, 369/215, 230, 233, 242, 247, 252; 318/615, 616, 617

[56] References Cited

U.S. PATENT DOCUMENTS

| | | | |
|---|---|---|---|
| 3,830,505 | 8/1974 | Rabinow | 369/230 |
| 4,102,536 | 7/1978 | Clunis | 369/233 |
| 4,111,433 | 9/1978 | Raabe | 369/220 |
| 4,130,786 | 12/1978 | Jacques | 318/616 |
| 4,138,121 | 2/1979 | Nakajima et al. | 369/233 |
| 4,139,811 | 2/1979 | Klinger | 318/615 |
| 4,200,828 | 4/1980 | Ridler et al. | 369/220 |

FOREIGN PATENT DOCUMENTS

| | | | |
|---|---|---|---|
| 54-146604 | 11/1979 | Japan | 369/215 |
| 55-28548 | 2/1980 | Japan | 369/220 |
| 55-42377 | 3/1980 | Japan | 369/215 |
| 55-77002 | 6/1980 | Japan | 369/215 |

*Primary Examiner*—John W. Shepperd
*Attorney, Agent, or Firm*—Hill, Van Santen, Steadman, Chiara & Simpson

[57] ABSTRACT

A record player is described having a turntable which is rotated by a pulsed motor energized from a motor drive circuit. The motor driving circuit includes a negative feedback servo loop which includes means for detecting vibration of the arm. Means is further provided for generating an output in response to the vibration of said tone arm. A high-pass filter is provided having a cut-off frequency which is the same or lower than the resonance frequency of the tone arm. The motor is controlled by an output of the servo loop in proportion to an accelerated velocity of the tone arm when said tone arm is vibrating at less than the cut-off frequency.

10 Claims, 9 Drawing Figures

RECORD PLAYER

BACKGROUND OF THE INVENTION

1. Field of the Invention

This invention relates to a record player, and more particularly to a new record player in which arm means is driven by an electro-magnet means.

2. Description of the Prior Art

In general, arm means such as tone arm provided in a record player is considered to be a principal factor to determine the low-range frequency response in the reproduction characteristics of the player and further serves as an important component to apply a proper stylus pressure to a transducer such as pickup means for enabling the same to trace a record groove correctly. The lowest frequency reproducible by the pickup means is dependent on the arm resonance frequency which is determined according to the resonance characteristic of the arm and is usually within a range of 4 Hz to 15 Hz. Normally, there exists in record disks some deformations including eccentricity and curvature or warp. Therefore, it is generally necessary for the arm to have a surplus stylus pressure so as to be capable of tracing the record groove completely in spite of such eccentricity and curvature. And the surplus stylus pressure required depends on the mechanical impedance of the arm in a low frequency range.

Since the arm often presents a sharp resonance characteristic at its resonance frequency, it is desirable in view of the reproduction characteristics that the resonance be dampened to flatten the characteristic. In the electronic control type record players developed heretofore, arm driving means is equipped with a velocity-proportional servo control circuit to dampen the resonance of the arm in the vicinity of its resonance frequency, thereby suppressing the resonance to improve the characteristics. However, if the servo gain of the velocity-proportional servo control is increased to attain sufficient suppression of the resonance, due to the travel of the arm caused by the sound groove on the record disk during the playing time or due to the relatively fast travel of the arm by the lead-out groove on the disk, a force opposite to the direction of the said travel by the groove is applied to the tip of a reproducing stylus where in this case the horizontal sensitivity is reduced. Generation of such a force brings about various problems including deterioration of the sound quality during the playing time and failure of the stylus in tracing the lead-out groove if the stylus pressure is small.

SUMMARY OF THE INVENTION

It is an object of the present invention to provide an improved record player which is capable of attaining satisfactory reproduction characteristics by sufficiently suppressing the resonance in the vicinity of the resonance frequency of its arm to flatten the frequency response.

Another object of the present invention resides in providing a record player wherein a reproducing stylus is rendered capable of properly tracking a record groove even with a small pressure by preventing deterioration of the horizontal sensitivity equivalently during the playing period or at the lead-out time.

Another object of the present invention resides in providing a record player adapted for prevention of deterioration that occurs in the reproduction characteristics as a result of deformation such as eccentricity or curvature of a record disk.

Another object of the present invention is to provide a record player capable of dampening the resonance of an arm without narrowing the reproduction frequency band.

And still a further object of the present invention is to provide a record player capable of displacing an arm up to a desired position with accuracy.

The record player according to the present invention is equipped with a driving motor for moving an arm, detector means for detecting the velocity of movement of the arm, and high-pass filter means whose cut-off frequency is slightly lower than the resonance frequency of the arm, wherein a servo control action is executed by the driving motor.

Furthermore, the record player of the present invention comprises a driving motor for moving the arm, detector means for detecting the velocity of movement of the arm, high-pass filter means whose cut-off frequency is slightly lower than the resonance frequency of the arm, servo means for effecting servo control to the driving motor, and means for selectively switching a feedback loop in such a manner as to feed the output signal of the detector means back to the servo means via the filter means during a playing time or to feed the said output signal back to the servo means directly during a non-playing time.

DESCRIPTION OF THE PREFERRED EMBODIMENTS

Figure 1:
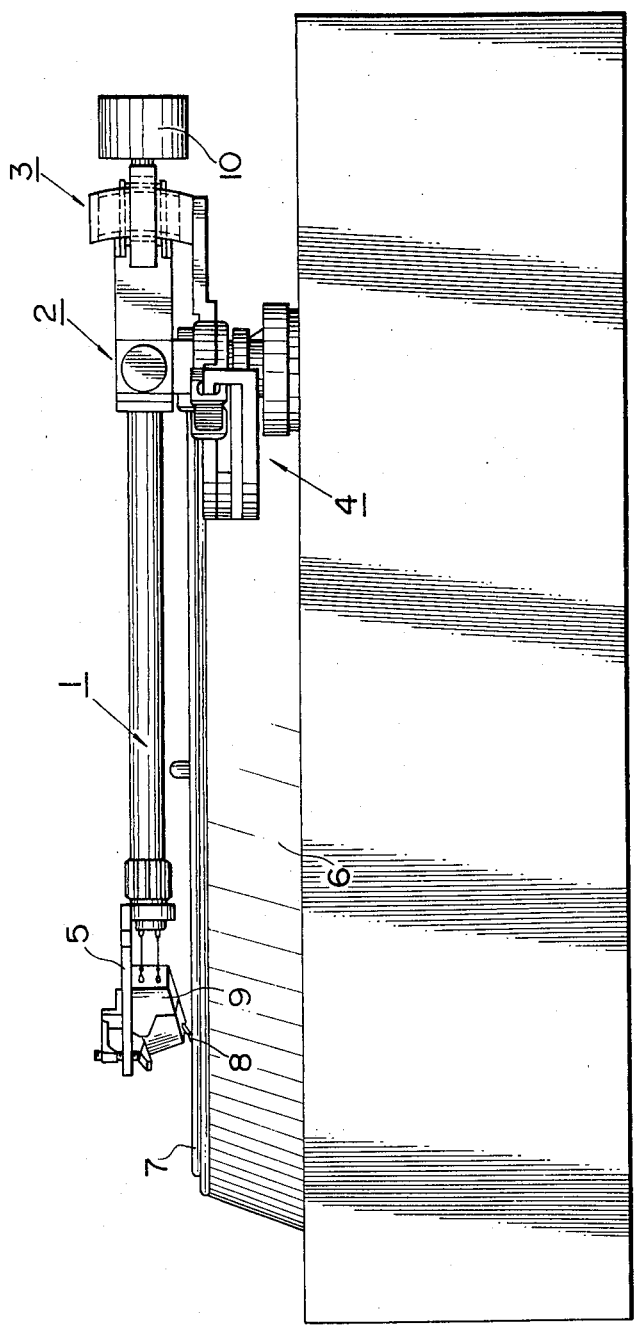
FIG. 1 is a side view schematically illustrating the structure of an electronic control type record player to which the present invention is applied.

First, with reference to FIG. 1, a description will be given on the general structure of an electronic control type record player to which the present invention is applied.

In the electronic control type record player where an arm 1 is operated by driving means such as a linear motor, the arm 1 is supported to be pivotable both vertically and horizontally by a bearing mechanism 2, and the vertical drive of the arm 1 is executed by a vertical driving motor 3 which consists of a linear motor equipped with a driving coil, a detector coil and a magnetic circuit and is under a feedback servo control, while the horizontal drive of the arm 1 is executed by a horizontal driving motor 4 consisting of a linear motor similar to the above. A pickup cartridge shell 5 attached to the fore end of the arm 1 is equipped with a transducer such as pickup cartridge 9 having a reproducing stylus 8 which tracks a groove on a record disk 7 placed on a turntable 6. At the base end of the arm 1, a balancing counterweight 10 is provided in the manner to be positionally adjustable in the axial direction of the arm 1. In such electronic control type record player, the arm 1 is balanced by the positional adjustment of the counterweight 10, and the stylus pressure is controlled by a stylus-pressure current flowing in the coil of the vertical driving motor 3. To both the vertical driving motor 3 and the horizontal driving motor 4 for moving the arm 1 in the vertical and horizontal directions individually, feedback control is effected by a detection signal which is the output of the detector coil and has a signal level proportional to the movement velocity of the arm 1.

Figure 2:
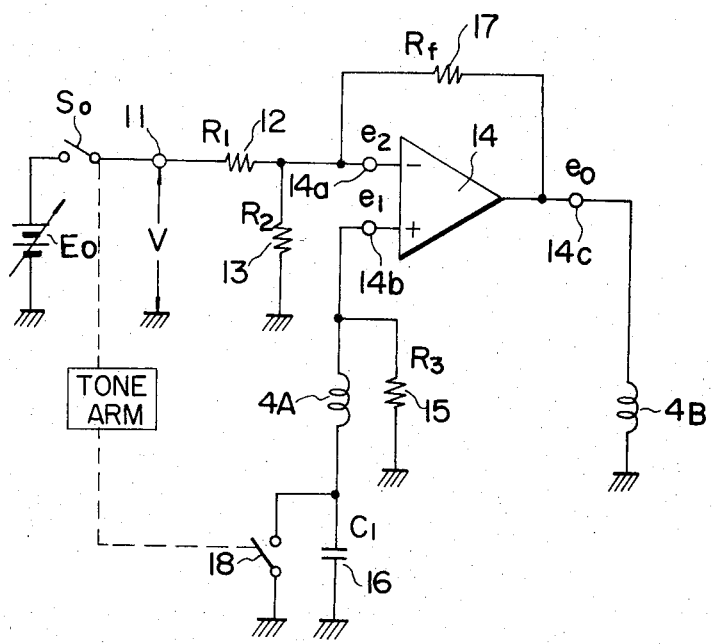
FIG. 2 is a block diagram of an exemplary servo circuit employed when the present invention is applied to the record player of FIG. 1.

Referring now to FIG. 2, an explanation will be given of an exemplary servo circuit employed when the present invention is applied to an electronic type record player having the above-described structure.

The servo circuit shown in FIG. 2 is a designed for effecting servo control to the horizontal driving motor 4, wherein a setting signal of a level representing a control target value is applied from a variable voltage source E via a switch $S_o$ to a signal input terminal 11, which is grounded via a series circuit consisting of resistors 12 and 13. The joint of these resistors is connected to a negative input terminal 14a of a servo amplifier 14 consisting of an operational amplifier. A positive input terminal 14b of the servo amplifier 14 is grounded via a resistor 15 and is grounded via a series circuit consisting of a capacitor 16 and a detector coil 4A provided to detect the movement velocity of the arm 1, wherein the detector coil 4A is coupled mechanically to the horizontal shaft of the arm 4. An output terminal 14c of the servo amplifier 14 is grounded via a driving coil 4B of the horizontal driving motor 4 while being connected to the negative input terminal 14a via a feedback resistor 17. The capacitor 16 is connected in parallel with a switch 18 closed in a non-playing state where the arm 1 is held at its upper position, and the joint of the capacitor 16 and the detector coil 4A is grounded via the switch 18. Thus, a negative feedback loop is formed by the coil 4A, the capacitor 16 and the resistor 15.

In the embodiment of the above-described structure, suppose now that a relationship $R_f > R_2$ is established regarding the resistance value $R_f$ of the feedback resistor 17 and the resistance values $R_1$, $R_2$ of the resistors 12, 13 connected in series between the signal input terminal 11 and the ground when the switch $S_o$ is closed. Then, if a setting signal of a level v is fed to the signal input terminal 11, an input signal of a level $e_2$ expressed as Eq. (1) is applied to the negative input terminal 14a of the servo amplifier 14.

$$e_2 \approx \frac{R_2}{R_1 + R_2} \cdot v \qquad \text{Eq. (1)}$$

The setting signal fed to the input terminal 11 has a level v representing the target value of a desired movement velocity of the arm 1. It is assumed here that the movement velocity is selectively settable as desired by the user of the player, and also that the signal of the level v is fed to the terminal 11 merely at the lead-in or lead-out time of the arm 1 but is not fed thereto during the disk playing period with the switch $S_o$ kept open. Since the switch 18 is closed at the lead-in or lead-out time of the arm 1, the output of the detector coil 4A connected between the terminal 14b of the servo amplifier 14 and the ground is fed to the input terminal 14b as a signal representing the movement velocity of the arm 1. The signal $e_1$ fed to the input terminal 14b and the aforementioned signal $e_2$ are compared with each other by the amplifier 14, whose comparison signal is then amplified to produce a signal $e_o$ at the output terminal 14c. As a result of the continuous comparison between the signals $e_1$ and $e_2$, the output of the detector coil 4A is increased in case the arm 1 is displaced abruptly or rapidly, thereby operating the servo amplifier 14 in the manner to reduce the output $e_o$. Consequently, the motor 4 is always driven at a constant velocity to perform a smooth lead-in or lead-out action of the arm 1.

Meanwhile, in the playing state where the arm 1 traces the groove on the disk, the switch $S_o$ is already opened. And upon interruption of the setting signal $E_o$ to the input terminal 11, the switch 18 is opened, so that the resistor 15 and the capacitor 16 are connected to the input terminal 14b of the servo amplifier 14. The circuit consisting of the resistor 15 and the capacitor 16 presents high-pass filter characteristics having a cut-off frequency $f_x$ expressed as $$f_c = \frac{1}{2\pi \cdot C_1 \cdot R_3} \qquad \text{Eq. (2)}$$

in which $R_3$ is the resistance value of the resistor 15, and $C_1$ is the capacitance value of the capacitor 16. With respect to the output signal of the detector coil 4A, the above circuit differentiates the frequency component lower than the cut-off frequency fc. The time constant determined by the resistor 15 and the capacitor 16 is so selected that the cut-off frequency fc becomes slightly lower than the resonance frequency fo of the arm.

Figure 3:
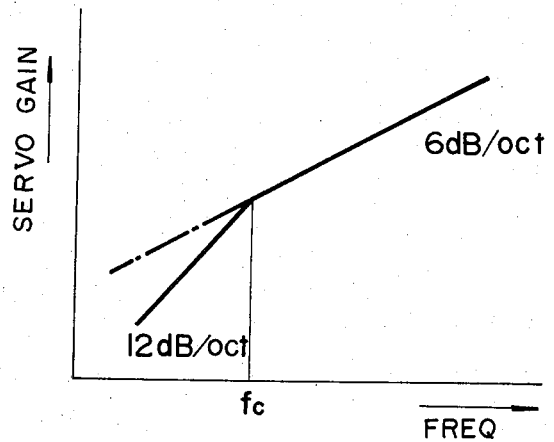
FIG. 3 graphically represents the servo characteristics of the circuit shown in FIG. 2.

When the switch 18 connected in parallel with the capacitor 16 is open in the above embodiment, the output signal of the detector coil 4A representing the movement velocity of the arm 1 is differentiated, in a frequency band below the cut-off frequency fc, by the circuit of the resistor 15 and the capacitor 16 according to the servo characteristic shown by the solid line in FIG. 3, and the differentiated signal proportional to the acceleration of the movement or vibration of the arm 1 is fed back to the positive input terminal 14b of the servo amplifier 14, thereby effecting acceleration-proportional servo control. In a frequency band above the cut-off frequency fc, the output signal of the detector coil 4A representing the movement velocity or vibration of the arm 1 is fed back directly to the positive input terminal 14b of the servo amplifier 14, thereby effecting velocity-proportional servo control. In the state where the switch 18 is open and the joint of the detector coil 4A and the capacitor 16 is shorted out via the switch 18, the differentiating circuit does not function so that, according to the servo characteristic shown by the one-dot chain line in FIG. 3, velocity-proportional servo control is effected over the entire frequency band. Normally, the switch 18 is so connected as to be actuated in relation to the vertical motion of the arm 1. For example, this switch is opened in response to the downward motion of the arm at the playing time or is closed in response to the upward motion thereof at the non-playing time.

Figure 4:
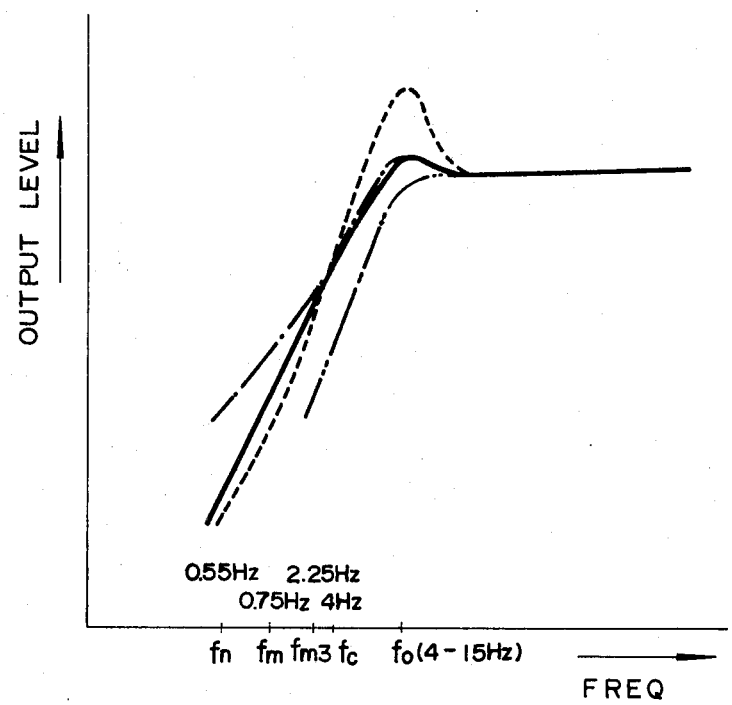
FIG. 4 graphically represents the reproduction frequency response of a record player equipped with the above servo circuit.

The solid line in FIG. 4 denotes the frequency response obtained by reproducing a prerecorded sweep signal from a disk by the electronic control type record player of FIG. 1 in the case where velocity-proportional and acceleration-proportional servo control actions are executed to the horizontal driving motor 4 with the switch 18 kept open. The one-dot chain line in FIG. 4 denotes the frequency response obtained by reproducing the said sweep signal in the case where a velocity-proportional servo control action alone is executed to the horizontal driving motor 4 with the switch 18 closed. Further in FIG. 4, the two-dot chain line shows the frequency response obtained by executing an acceleration-proportional servo control action alone to the horizontal driving motor 4, and the broken line shows the frequency response obtained without effecting any servo control to the horizontal driving motor 4.

In this embodiment, as is obvious from FIG. 4, acceleration-proportional servo control is effected to the horizontal driving motor 4 in a frequency band below the cut-off frequency fc (e.g. 4 Hz) which is selected to be slightly lower than the response frequency fo (ranging from 4 to 15 Hz) of the arm 1. Therefore, the servo gain is reduced by the acceleration-proportional servo control in the extremely low frequency band where harmful influence is caused by any deformation of the record disk 7 such as eccentricity of curvature, so that it becomes possible to achieve complete follow-up of the arm 1 in spite of the eccentricity or curvature. Also plotted in FIG. 4 are the fundamental-frequency component fn produced by the eccentricity of the record disk 7 at 33 r.p.m., the fundamental-frequency component fm produced by the eccentricity of the record disk 7 at 45 r.p.m., and the third harmonic component fm3. In the low frequency band where the frequency components fn, fm and fm3 resulting from the eccentricity of the record disk 7 are present, the acceleration-proportional servo control is effected to reduce the servo gain more than in the velocity-proportional servo control, thereby making it possible to prevent the deterioration of the reproduction characteristics that may otherwise be caused by the disturbance (such as curvature or eccentricity of the record disk 7) during the playing period. Moreover, since a sufficiently high servo gain is obtainable in the vicinity of the resonance frequency fc of the arm 1 by the velocity-proportional servo control, the resonance of the arm 1 can be suppressed to flatten the reproduction characteristics. Furthermore, differing from the case where the acceleration-proportional servo control alone is effected to the horizontal driving motor 4 to bring about a reduction of the low-range frequency component in the reproduction band as shown by the two-dot chain line in FIG. 4, execution of both the velocity-proportional and acceleration-proportional servo control actions in combination accomplishes an optimal control for the horizontal driving motor 4 without narrowing the reproduction frequency band.

Figure 5:
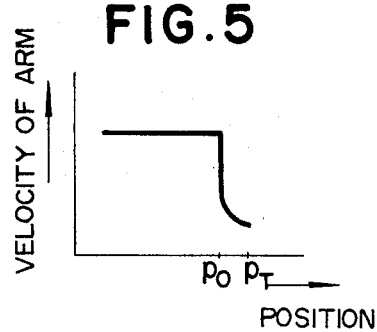
FIG. 5 is an explanatory diagram illustrating a stop mode in the case of driving an arm with a switch open in the above servo circuit.
Figure 6:
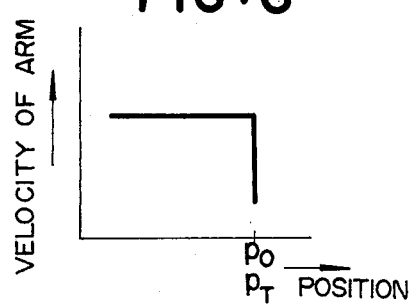
FIG. 6 is an explanatory diagram illustrating a stop mode in the case of driving the arm with the switch closed in the above servo circuit.
Figure 7:
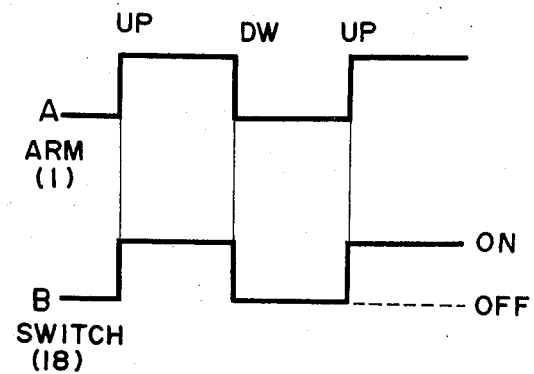
FIG. 7 is an explanatory diagram illustrating how the switch is actuated.

At the non-playing time such as lead-in or lead-out time, the switch 18 is closed to effect the velocity-proportional servo control to the horizontal driving motor 4 over the entire frequency band, so that the arm 1 can be brought to a stop accurately at the lead-in or lead-out point of the pickup, that is, at the down-point or up-point of the arm 1. In the above-described case where both the velocity-proportional and acceleration-proportional servo control actions are executed in combination, the servo gain in the low-range frequency band under the acceleration-proportional servo control becomes smaller, with increase of the frequency, than that in the velocity-proportional servo control. Therefore, when the arm 1 is to be stopped at a desired position $T_o$, the actual stop position PT thereof may deviate from the desired position $T_o$ as shown in FIG. 5. During the non-playing time to perform such a downward or upward operation of the arm 1, the switch 18 is closed to effect the velocity-proportional servo control with a sufficiently great gain even to an extremely low movement velocity of the arm 1, thereby stopping the arm 1 accurately at the desired position $P_o$ as shown in FIG. 6. The switch 18 is constituted by a mechanical or electronic switch closed or opened under control in relation to the upward or downward actuation of the arm 1. As plotted in FIG. 7, this switch may be so disposed as to open at the down-motion end time DW of the arm 1 and to close at the upward-motion start time UP thereof. FIG. 7A shows the state of actuation of the arm 1, and FIG. 7B shows the on-off control state of the switch 18.

Figure 8:
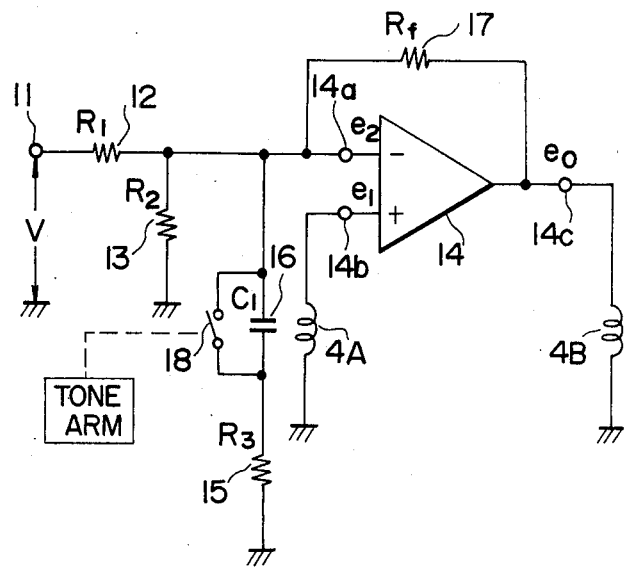
FIG. 8 is a block diagram of another example of a servo circuit employed when the present invention is applied to the electronic control type record player of FIG. 1.
Figure 9:
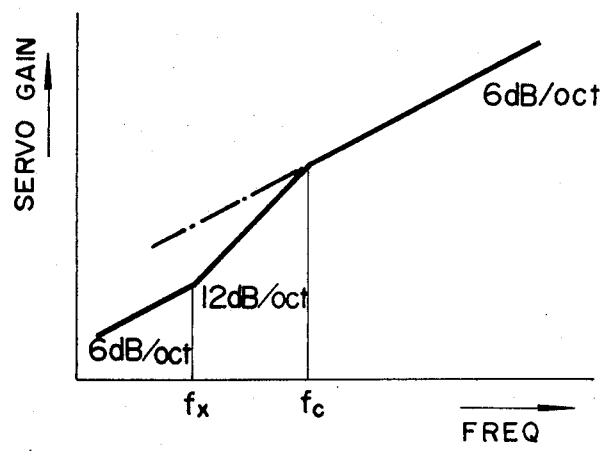
FIG. 9 graphically represents the servo characteristics of the circuit shown in FIG. 8.

In the above embodiment, the resistor 15 and the capacitor 16 for differentiating the velocity detection signal obtained from the detector coil 4A are connected to the positive input terminal 14b of the servo amplifier 14. However, the same operation can also be performed in another embodiment where the resistor 15 and the capacitor 16 are connected to the negative input terminal 14a of the servo amplifier 14, as shown in FIG. 8. In the embodiment of FIG. 8, the positive input terminal 14b of the servo amplifier 14 is grounded via the detector coil 4B, while the negative input terminal 14a of the servo amplifier 14 is grounded via a series circuit consisting of the capacitor 16 and the resistor 15, and a switch 18 is connected in parallel with the capacitor 16. In this circuit, the same reference numerals as those used in FIG. 2 denote equivalent components, and a detailed explanation is omitted. In the structure of FIG. 8, the servo characteristic represented by the solid line in FIG. 9 is obtained through a combination of velocity-proportional servo control and acceleration-proportional servo control during the off-state of the switch 18. When this switch is turned on, the servo characteristic obtained through the velocity-proportional servo control is such as represented by the one-dot chain line in FIG. 9. One cut-off frequency fc shown in FIG. 9 is expressed as the foregoing Eq. (2) and is so selected as to become slightly lower than the resonance frequency fo of the arm; while the other cut-off frequency fx is expressed as $$f_x = \frac{1}{2\pi \cdot C_1 \cdot R_f} \qquad \text{Eq. (3)}$$

the frequency fx is selected to be sufficiently low so as not to be affected by the curvature or eccentricity of the record disk 7.

It is to be understood that the present invention is not limited to any of the above-described embodiments alone, and the vertical driving motor 3 may be servo-controlled by the servo circuit of the aforementioned structure.

According to the present invention, as is manifest from the description of each embodiment, the arm driving motor is servo-controlled by a combination of velocity-proportional servo control and acceleration-proportional servo control which are executed at the two sides of the cut-off frequency slightly lower than the resonance frequency of the arm. Therefore, it is possible to completely suppress the resonance in the vicinity of the resonance frequency of the arm for attaining flat reproduction frequency characteristics without narrowing the reproduction band, and further to enable the pickup to trace the record groove properly without generating any unnecessary force in the arm against disturbance, hence achieving an improved record player which is capable of offering remarkably excellent reproduction characteristics.

It is to be noted that the player according to the present invention is applicable to a video disk device as well as to an audio device.

It will be apparent to those skilled in the art that many modifications and variations may be effected without departing from the spirit and scope of the novel concepts of the present invention.

I claim as my invention:

1. A record player, comprising: an arm having a predetermined resonance frequency, a turntable adapted to carry a disk, a motor connected for driving said arm in a horizontal direction with respect to said disc carried on said turntable, a motor driving circuit means connected to said motor and including a negative feedback servo loop, said servo having a detector means for detecting vibration of said arm and for generating an output frequency in response to said vibration of said arm, said servo loop including a high pass filter having a cut-off frequency which is the same or lower than said resonance frequency, the motor being controlled by an output of said motor driving circuit means in proportion to an accelerated velocity of said arm when said arm is vibrated at less than said cut-off frequency.

2. The record player as defined in claim 1, wherein said servo loop further includes a switch means for connecting said high-pass filter to and disconnecting the same from said servo loop.

3. The record player as defined in claim 2, wherein said high-pass filter includes a capacitor, and said switch means is connected in parallel with said capacitor.

4. The record player as defined in claim 3, wherein said switch means is connected to be opened only when said arm is in a disk playing state.

5. The record player as defined in claim 2, wherein said switch means is connected to be opened only when said arm is in a disk playing state.

6. The record player as defined in claim 1, wherein said cut-off frequency of said filter is set to be approximately 4 Hz when said resonance frequency of said arm is selected to be within a range of 4 to 15 Hz.

7. The record player as defined in claim 1, wherein said motor driving circuit means includes an operational amplifier having two input terminals of different polarities, and when said arm is in a non-playing state, means for connecting a predetermined bias source to one of the input terminals of said amplifier, said servo circuit including said detector being connected to the other input terminal.

8. The record player as defined in claim 7, wherein the high-pass filter comprises a capacitor which is connected in series with said detector.

9. The record player as defined in claim 7, wherein said high-pass filter includes a capacitor connected between one terminal of said operational amplifier and ground.

10. A record player, comprising: an arm having a predetermined resonance frequency, a turntable adapted to carry a disk, a motor connected for moving said arm in a horizontal direction with respect to said disk carried on said turntable, a motor driving circuit means connected to said motor including a negative feedback servo loop, said servo loop having a detector means for detecting movement of said arm and for generating an output frequency in response to said movement, said servo loop including a high-pass filter having a cut-off frequency which is substantially no higher and preferably lower than said resonance frequency, the motor being controlled by an output of said motor driving circuit means in proporation to an accelerated velocity of said arm when said arm is moved at less than said cut-off frequency.

* * * * *